United States Patent [19]
Ganapathy et al.

[11] Patent Number: 5,426,650
[45] Date of Patent: Jun. 20, 1995

[54] FULL SCAN OPTIMIZATION TECHNIQUE USING DRIVE ONE/DRIVE ZERO ELEMENTS AND MULTIPLE CAPTURE CLOCKING

[75] Inventors: Gopi Ganapathy; Robert Thaden; Steve Horne, all of Austin, Tex.

[73] Assignee: Advanced Micro Devices, Inc., Sunnyvale, Calif.

[21] Appl. No.: 273,282

[22] Filed: Jul. 11, 1994

Related U.S. Application Data

[63] Continuation of Ser. No. 980,670, Nov. 24, 1992, abandoned.

[51] Int. Cl.⁶ .............................................. H04B 17/00
[52] U.S. Cl. .................................................. 371/22.3
[58] Field of Search ...................... 371/22.3, 25.1, 22.1, 371/22.5, 15.1, 158

[56] References Cited

U.S. PATENT DOCUMENTS

| | | | |
|---|---|---|---|
| 4,553,236 | 11/1985 | Zasio et al. | 371/15 |
| 5,047,710 | 9/1991 | Mahoney | 324/158 R |
| 5,109,383 | 4/1992 | Chujo | 371/22.3 |

OTHER PUBLICATIONS

Hill et al., Digital Systems:Hardware Organization and Design, 1978, pp. 79–81.
Nail Waste et al., Principles of CMOS VLSI Design, Oct. 1985, p. 215.
M. Mano, Digital Design, 1984, p. 59.
*Principles of CMOS VLSI Design*, A Systems Perspective, Weste et al., p. 215.
*Digital Design*, Second Edition, Mano, p. 59.
Gallup et al., "Testability Features of the 68040", Paper 33.2, pp. 749, 754–755, 1990 International Test Conference.

*Primary Examiner*—Robert W. Beausoliel, Jr.
*Assistant Examiner*—Norman M. Wright
*Attorney, Agent, or Firm*—Foley & Lardner

[57] ABSTRACT

A test circuit and test technique for scan testing integrated circuits is disclosed. The test circuit includes a drive 1 or drive 0 scan element which utilizes fewer transistors than conventional scan latches. The testing technique utilizes the clock input to the latches in the ICs for propagating data through the latches. The test circuit and test techniques may be used with microprocessors and particularly RISC microprocessors. The test technique includes coupling a drive 1 or drive 0 element to a logic element coupled to a general latch. The drive 1 or drive 0 scan element allows the general latch to be clocked by a clock signal such as a $\phi 1$ clock signal or $\phi 2$ clock signal.

21 Claims, 4 Drawing Sheets

FULL SCAN OPTIMIZATION TECHNIQUE USING DRIVE ONE/DRIVE ZERO ELEMENTS AND MULTIPLE CAPTURE CLOCKING

This is a continuation of application Ser. No. 07/980,670 filed Nov. 24, 1992 abandoned.

CROSS REFERENCE TO RELATED APPLICATIONS

The present application is related to copending application Ser. No. 07/995,754, entitled "Pseudo Master Slave Capture Mechanism For Scan Elements", invented by Gopi Ganapathy, filed on Dec. 23, 1992.

1. Field of the Invention

This invention relates to the field of test circuits and test techniques for integrated circuits (ICs) and, in particular, to scan testing elements used in the testing of microprocessors, RISC microprocessors and other ICs which include sequential elements.

2. Background of the Invention

After manufacturing an electronic chip or IC, the IC must be tested to ensure that it operates properly. Scan testing is an efficient method for determining which portions of an IC are working properly. Generally, ICs are tested by providing particular inputs to the IC and analyzing the outputs from the IC. If the IC provides the proper outputs to the particular inputs, the manufacturer is assured that the IC is working properly.

Certain faults or defects in the IC are difficult to determine because they are not directly detectable or visible from any output pins. Scan testing is a test technique which provides visibility to interior circuitry of the IC. Scan testing isolates portions of the IC by providing input test data or vectors designed to analyze predetermined portions of the IC. Thus, the input vectors allow the outputs at the pins to reveal defects in the interior circuitry of the IC.

Testing may be economically implemented on non-sequential or combinatorial ICs. However, when the IC includes sequential elements such as latches, flip-flops, or other state devices testing becomes very difficult. Sequential elements include any device in which the output of the device is dependent on the particular state of the device. ICs which may include sequential elements are microprocessors, memories, registers, caches, or the like. Such sequential devices are thus very difficult to test because the states of the devices which are internal to the IC are not readily apparent and may not be readily loaded.

In order to facilitate testing of ICs such as microprocessors which utilize sequential elements, scan cells are placed in the IC. The scan cells generally appear transparent when the IC is in normal operation or system mode. When the IC is in the test mode, the scan cells perform the function of the sequential elements they replace and generally may be loaded with particular data. Further, the scan cells may drive the loaded data or capture data associated with the sequential elements. The captured and loaded data may be output by the scan cells. This data facilitates the scan testing analysis.

In the test mode, the sequential nature of the circuitry is eliminated and all test data is processed through the scan cells. Thus, scan cells operate to make the sequential elements appear to be combinatorial elements in the test mode so that the various portions of the microprocessor may be analyzed for defects.

Although the scan cells make testing easier and more efficient, the scan cells are extra devices which must be added to the IC. In addition, such scan cells may require as many as 32 transistors or more. Furthermore, the scan cells often introduce delay into the normal operation of the IC. Thus, the scan cells are a detriment to the cost, size and speed of the ICs.

SUMMARY OF THE INVENTION

The present invention provides a circuit in an integrated circuit formed by a plurality of circuit elements including at least one sequential circuit element being clocked at a clock input by a combination of a data signal and a system clock during normal operation. The improvement of a test arrangement enabling the sequential element to be tested comprises a gate means having an output coupled to the clock input, a first input for receiving the system clock, and a second input. The test arrangement also includes a test mode means having an output coupled to the second input and a first input for receiving a data signal. A second input of the test mode means receives a test mode signal. The test mode means conveys a steady state control signal to the second input of the gate means in response to the test mode signal. The steady state signal causes the sequential circuit element to be clocked by the system clock. The test mode means also conveys the data signal to the second input of the gate means in the absence of the test mode signal so that the sequential element is clocked by the combination of the system clock and the logic signal.

The present invention may also provide that the test arrangement includes a latch means coupled to the input of the test mode means for storing an inverted or noninverted signal on the input of the test mode means. The invention also provides that the latch means may further include a shift mode input, a shift register output, and a transfer gate having a control input coupled to the shift mode input, an output coupled to the input of the latch means and a data input. The transfer gate allows the signal at the input of the transfer gate to be applied to the input of the latch when the shift mode signal is present on the shift mode input.

The present invention may also relate to the test arrangement further including a capture mode input and a capture transfer gate having a control input coupled to the capture mode input, an input coupled to the input of the test mode means, and an output coupled to the input of the latch means. The capture transfer gate allows the signal on the input of the test mode means to be applied to the input of the latch when a signal on the capture mode input is present.

The present invention also provides a drive element for use in scan testing an integrated circuit having sequential elements. The drive element includes a data input, a data output, a test mode input, a transfer gate, and a transistor. The test mode input receives a test mode signal indicative of a system mode or a test mode. The transfer gate is coupled between the data input and the data output. The transfer gate allows data to be transferred from the data input to the data output when the integrated circuit is in the system mode. The transistor drives a predetermined logic level when the system is in the test mode. The present invention may also provide that the transistor drives a logic LOW or a logic HIGH.

The present invention provides an improvement in an integrated circuit including a circuit formed by a plurality of circuit elements, at least some of said circuit elements being sequential circuit elements which are clocked by a system clock with at least one of said sequential circuit elements being clocked at a clock input by a combination of both a logic (or data) signal and the system clock during normal operation. The improvement includes a test mode means responsive to a test mode signal for causing said at least one sequential circuit element to be clocked by said system clock alone and being responsive to the absence of said test mode signal to cause said at least one sequential element to be clocked by the combination of said clock and said logic (or data) signal.

The present invention also relates to a drive scan latch for use in an integrated circuit. The drive scan latch includes a scan latch input, a scan latch output, and a test mode means. The test mode means is coupled between the scan latch input and the scan latch output. The test mode means provides a signal at a predetermined logic level at the scan latch output when a test signal is present and provides a logic signal at the scan latch input to the scan latch output when the test signal is absent.

BRIEF DESCRIPTION OF THE DRAWINGS

The features of the present invention which are believed to be novel are set forth with particularity in the appended claims. The invention, together with further objects and advantages thereof, may best be understood by making reference to the following description taken in conjunction with the accompanying drawings, in the several Figures of which like reference numerals indicate identical elements, and wherein:

DETAILED DESCRIPTION OF PREFERRED EXEMPLARY EMBODIMENT OF THE PRESENT INVENTION

Figure 1:
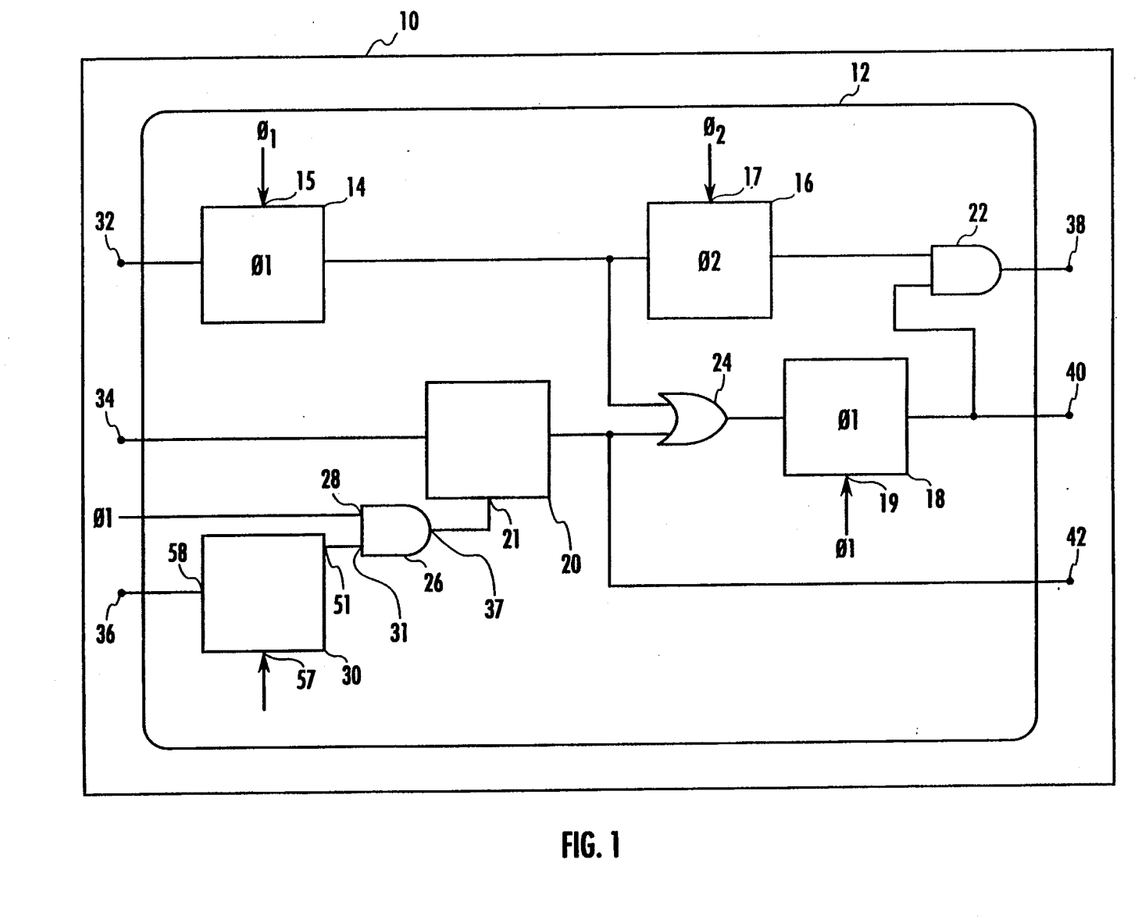
FIG. 1 is a schematic block diagram of a circuit portion of an integrated circuit embodying the present invention configured for the testing of sequential elements therein in accordance with the present invention.

FIG. 1 is a schematic block diagram of a circuit portion 12 of an integrated circuit 10 embodying the present invention configured for the testing of sequential elements therein in accordance with the present invention. The circuit portion 12 includes a latch 14, a latch 16, a latch 18, a latch 20, an AND gate 22, an OR gate 24, and an AND gate 26. Latches 14, 16, 18, and 20 are sequential elements. Gates 26, 24 and 22 are non-sequential elements. The circuit components in the portion 12 may be replaced by other types of circuitry and are shown only as an example.

Latches 14 and 18 are controlled by a $\phi 1$ clock signal provided to the clock inputs 15 and 19 of the latches 14 and 18, respectively. The latch 16 is controlled by a $\phi 2$ clock signal at the clock input 17 of the latch 16. The $\phi 1$ and $\phi 2$ clock signals are preferably system clock signals such as internal microprocessor clock signals which are well known in the art.

The latch 20 is a general latch which is clocked at a clock input 21 by the combination of a logic signal and a system clock signal $\phi$, at an output 37 of the AND gate 26 during normal operation. The AND gate 26 receives a $\phi 1$ clock signal at an input 28 and a logic signal at an input 31 which is conveyed through a drive scan latch 30 from input 36 in accordance with a preferred exemplary embodiment of the present invention. The output 37 of the AND gate 26 and thus the clocking of latch 20 is a function of the logic signal at the input 31 and the $\phi 1$ clock signal at the input 28. Thus, the latch 20 is difficult to test because it is clocked by the combination of the clock signal and a logic signal during normal operation.

In order to test the circuit 12, the IC enters a test mode with a test mode signal appearing at a test mode input 57 of drive scan latch 30 and data is provided at inputs 32, 34 and 36, which inputs may be external pins of the IC or other connections from other circuit portions. The circuit 12 outputs data on external pins 38, 40 and 42. When in the test mode, the use of a scan latch for each and every latch is advantageously avoided by use of the drive scan latch 30. When in the test mode the drive scan latch 30 provides a constant logic 1 control signal at the input 31 so that the $\phi 1$ clock signal at the input 28 of AND gate 26 is provided to the latch 20. Hence, when in the test mode, the latch 20 is clocked by the system clock $\phi 1$. However, as will be seen hereinafter, data provided at input 36 may be latched within drive scan latch 30 during the test mode.

When in the test mode, the outputs of the elements in the circuit 12 can be tested by providing various inputs at the inputs 32 and 34 and comparing the output values with expected output values at the pins 38, 40 and 42. For example, in the test mode, the clock $\phi 1$ and clock $\phi 2$ signals would be provided to the latches 14, 16, 18 and 20 and data would be provided at the inputs 32 and 34. If logic 1's were provided at the inputs 32 and 34, a logic 1 would be provided at the pin 40 after two clock pulses of signal $\phi 1$. Further, a logic 1 would be provided at the pin 38 after a $\phi 1$ pulse, a $\phi 2$ pulse, and lastly another pulse of the system clock signal. If a logic 1 is provided at the input 32 and a logic 0 is provided at the input 34, a logic 1 would be provided at the pins 38 and 40 after two $\phi 1$ clock pulses and one $\phi 2$ clock pulse. A logic 0 would be provided at the pin 42 after one $\phi 1$ clock pulse. Of course, various other input test vectors could be used. Thus, the drive scan latch 30 and AND gate 26 form a test arrangement which enables the sequential elements of the circuit portion 12 to be tested by scan testing without the need of conventional scan latches. Therefore, drive scan latch such as drive scan latch 30 is preferably used with each general latch such as latch 20.

Further, the drive scan latch 30 is capable of capturing data at the input 36. Generally, the drive scan latch 30 includes a latch for receiving data provided at a data input. The latch may be coupled to other test circuit components such as other drive scan latches for outputting the data at the input 36. Thus, the drive scan latch 30 may also perform the test function of capturing data at the input 36.

When the IC or microprocessor is not in the test mode, the drive scan latch 30 does not effect the data at the input 36. Thus, when not in the test mode, the signal at the input 36 is provided to the input 31 of the AND gate 26 for normal operation.

Conventional approaches employed in the prior art would have required that the latch 20, latch 14, latch 16, and latch 18 be operationally replaced by additional conventional scan latches. The design of the circuit portion 12 allows the additional conventional scan latches to be eliminated because the testing technique employed in FIG. 1 allows the clock signals to propagate the data across the circuit portion 12. Drive scan latch 30 further eliminates the need for a scan latch to replace the latch 20 because the drive scan latch 30 allows the clock signal $\phi 1$ to be used to pulse the latch 20. Thus, the scan testing optimization technique in accordance with the present invention as illustrated in the embodiment of FIG. 1 allows four scan latches to be eliminated by virtue of the arrangement of drive scan latch 30 and the AND gate 26 coupled thereto as illustrated in FIG. 1, with the net effect of eliminating three scan latches previously required.

Figure 2:
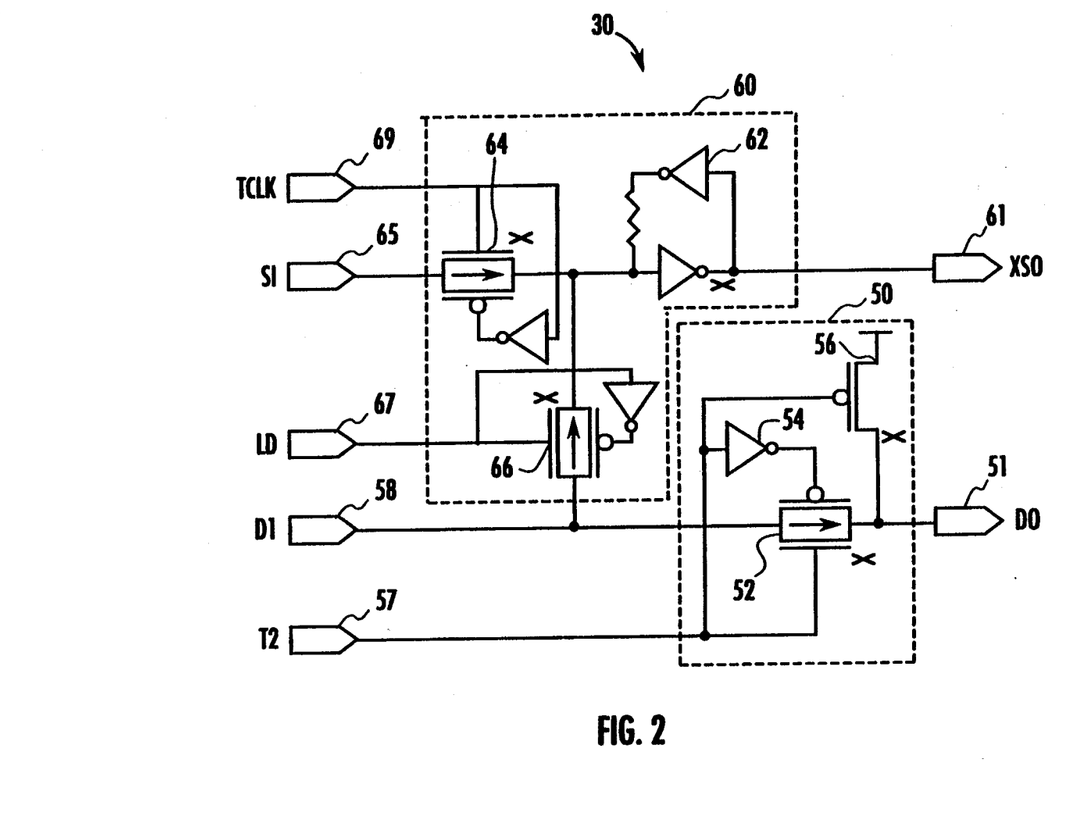
FIG. 2 is a schematic diagram of a drive scan latch configured in accordance with a preferred exemplary embodiment of the present invention.

Referring now to FIG. 2, it illustrates the drive scan latch or element 30 in greater detail which may be the drive scan latch 30 of FIG. 1 for practicing the present invention in accordance with this preferred embodiment. The element 30 includes a test mode portion 50 and a latch portion 60. The test mode portion 50 includes a transfer gate 52, an inverter 54, and a P-channel field-effect transistor 56. The latch portion 60 includes a transfer gate 64, a latching element 62 and a transfer gate 66. A transfer gate is a pass through gate or other device which allows data at its input to be applied to its output in response to a control signal. Transfer gates 64 and 66 include built-in inverters (not shown) similar to inverter 54. A latching gate or latching element has a feedback mechanism to store logic values.

A test mode input 57 is coupled to the control input of the transfer gate 52. An input of the transfer gate 52 is coupled to a data input 58. The data input 58 is for coupling to the input 36 in FIG. 1. A shift register input 65 is coupled to the input of the transfer gate 64. The output of the transfer gate 64 is coupled to the input of the latching element 62. The output of the latching element 62 is coupled to a shift register output 61. A shift mode input 69 is coupled to the control input of the transfer gate 64. The output of the transfer gate 66 is coupled to the input of the latching element 62.

A capture mode input 67 is coupled to the control input of the transfer gate 66. The data input 58 is coupled to the inputs of the transfer gate 66 and the transfer gate 52. The output of the transfer gate 52 is coupled to a data output 51. The transfer gate 52 is controlled by a test mode input 57.

The output of the inverter 54 is coupled to the inverted control input of the test mode gate 52. The inverted control input allows data to transfer across the transfer gate 52 when the inverted control input is a logic LOW. The gate of the transistor 56 is coupled to the output of the inverter 54. The input of the inverter 54 is coupled to the test mode input 57. The source of the transistor 56 is coupled to a positive logic HIGH voltage source (+V), and the drain of the transistor 56 is coupled to the data output 51.

In operation, when the test mode input 57 is a logic HIGH for normal operation, the transfer gate is turned ON and the transistor 56 is turned OFF, as a result, data is allowed to be transferred from the data input 58 to the data output 51 without obstruction from the drive element 30. This would permit a sequential element such as latch 20 of FIG. 1 to be clocked by the combination of a logic signal and a system clock signal. When in the test mode and input 57 is a logic LOW, the transfer gate 52 is turned OFF and the transistor 56 is turned ON. As a result, a steady state logic HIGH control signal is provided at the data output 51. This would permit the aforementioned latch 20 to be clocked by the system clock signal alone.

Figure 3:
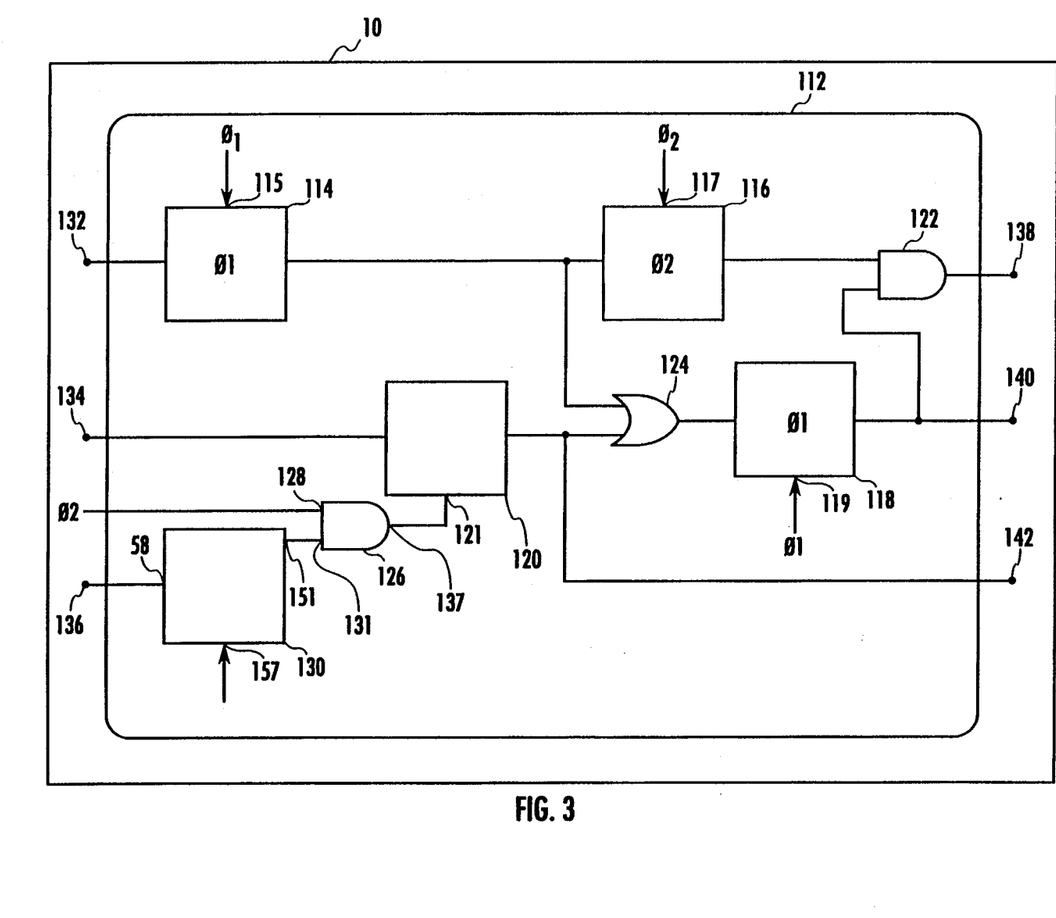
FIG. 3 is a schematic block diagram of another circuit portion of an integrated circuit embodying the present invention configured for the testing of the sequential elements therein in accordance with the present invention.

The latching element 62 provides shift register and data capture functions for the element 30. When the shift mode input 69 is a logic HIGH, the input at the shift register input 65 is provided to the input of the latching element 62. The latching element 62 provides an inverted data signal at the serial register output 61 in response to a clock signal. The data at the data input 58 may also be provided to the input of the latch 56 when the capture mode input 67 is a logic HIGH. When the capture mode input 67 is a logic HIGH, the transfer gate 66 provides the data at the data input 58 to the input of the latching element 62. The latching element 62 provides the inverted data to the shift register output FIG. 3 is a schematic block diagram of a circuit portion 112 of an integrated circuit 10 embodying the present invention configured for the testing of sequential elements therein in accordance with the present invention. Circuit portion 112 includes a latch 114, a latch 116, a latch 118, a latch 120, an AND gate 122, an OR gate 124, and an OR function gate 126. The OR function gate 126 is an AND gate with an inverted input 131 coupled to the scan element 130. Portion 112 is substantially similar to portion 12 except that the drive scan element 30 is replaced with a drive scan element 130 which drives a logic 0 and AND gate 26 is replaced by OR function gate 126. Gates 126, 124 and 122 are non-sequential elements. The circuit components in the portion 112 may be replaced by other types of circuitry and are shown only in an exemplary and non-limiting sense.

Latches 114 and 118 are controlled by a $\phi 1$ clock signal provided to the clock inputs 115 and 119, respectively. The latch 116 is controlled by a $\phi 2$ clock signal at the clock input 117 of the latch 116. The $\phi 1$ and $\phi 92$ clock signals are preferably system clock signals such as internal microprocessor clock signals which are well known in the art.

The latch 120 is a general latch which is clocked at clock input 121 by the combination of a logic signal and $\phi 2$ clock signal at an output 137 of the OR function gate 126 during normal operation. The OR function gate 126 receives a $\phi 2$ clock signal at an input 128 and a logic signal at an input 131 which is conveyed through the drive scan latch 130 in accordance with a preferred exemplary embodiment of the present invention. The output 137 of the OR function gate 126 and thus the clocking of the latch 120 is a function of the logic signal at the input 131 and the $\phi 2$ clock signal at the input 128. Thus, the latch 120 is difficult to test because it is clocked by the combination of the $\phi 2$ clock signal and a logic signal during normal operation.

In order to test the circuit 112, the IC 10 enters a test mode with a test mode signal appearing at a test mode input 157 of drive scan latch 130 and data is provided at inputs 132, 134 and 136, which inputs may be external pins of the IC or other connections from other circuit portions. The circuit 112 outputs the data on the external pins 38, 40 and 42. When in the test mode, the use of a scan latch for each and every latch is advantageously avoided by use of the drive scan latch 130. When in the test mode the drive scan latch 130 provides a constant logic 0 control signal at the input 131 in the test mode so that the φ2 clock signal at the input 128 of the OR function gate 126 is provided to the latch 120. Hence, when in the test mode, the latch 120 is clocked by the system clock φ2 alone. However, as will be seen hereinafter, data provided at the input 136 may be latched within the drive scan latch 130 during the test mode.

When in the test mode, the outputs of the elements in the circuit 112 can be tested by providing various inputs at the inputs 132 and 134 and comparing the output values with expected output values at the pins 138, 140 and 142. For example, in the test mode, the clock φ1 and clock φ2 signals would be provided to the latches 114, 116, 118 and 120 and data would be provided at the inputs 132 and 134. If logic 1's were provided at the inputs 132 and 134, a logic 1 would be provided to the pin 140 after two clock pulses of signal φ1. Further, a logic 1 will be provided at the pin 138 after a φ1 pulse, a φ2 pulse, and lastly, another φ1 pulse of the system clock signal. If a logic 1 is provided at the input 132 and a logic 0 is provided at the input 134, a logic 1 would be provided at the pins 138 and 140 after two φ1 clock pulses and one φ2 clock pulse. A logic 0 would be provided at the pin 142 after one φ2 clock pulse. Of course, various other input test vectors could be used. Thus, the drive scan latch 130 and OR function gate 126 form a test arrangement which enables the sequential elements of the circuit portion 112 to be tested by scan testing and boundary scan testing techniques without the need of conventional scan latches. Therefore, a drive scan latch such as drive scan latch 130 is preferably used with each general latch such as general latch 120.

Further, the drive scan latch 130 is capable of capturing data at the input 136. Generally, the drive scan latch 130 includes a latch for receiving data provided at a data input. The latch may be coupled to other test circuit components, such as other drive scan latches, for outputting the data at the input 136 or the input 134. Thus, the drive scan latch 130 may also perform the test function of capturing data at the input 136 or the input 134.

When the IC or microprocessor is not in the test mode, the drive scan latch 130 does not affect the data at the input 136. Thus, when not in the test mode, the signal at the input 136 is provided to the input 131 of the OR function gate 126 for normal operation.

Conventional approaches employed in the prior art would have required that the latch 120, latch 114, latch 116 and latch 118 be operationally replaced by additional conventional scan latches. The design of the circuit portion 112 allows the additional conventional scan latches to be eliminated because the testing technique employed in FIG. 3 allows the clock signals to propagate the data across the circuit portion 112. Drive scan latch 130 further eliminates the need for a scan latch to replace the latch 120 because the drive scan latch 130 allows the clock signal φ2 to be used to pulse the latch 120. Thus, the scan testing optimization technique in accordance with the invention as illustrated in the embodiment of FIG. 3 allows four scan latches to be eliminated by virtue of the arrangement of drive scan latch 130 and the OR gate 26 coupled thereto as illustrated in FIG. 3, With the net effect of eliminating three scan latches previously required.

These reductions in scan latches result in significant reduction in the total number of transistors required for the portion 112. For example, conventional scan latches can require 32 or more transistors. Further, the design of the scan latch 130 requires only 17 transistors. Thus, by utilizing the drive scan latch 130 in accordance with the testing technique, an approximately 87% reduction in the number of transistors may be accomplished.

Figure 4:
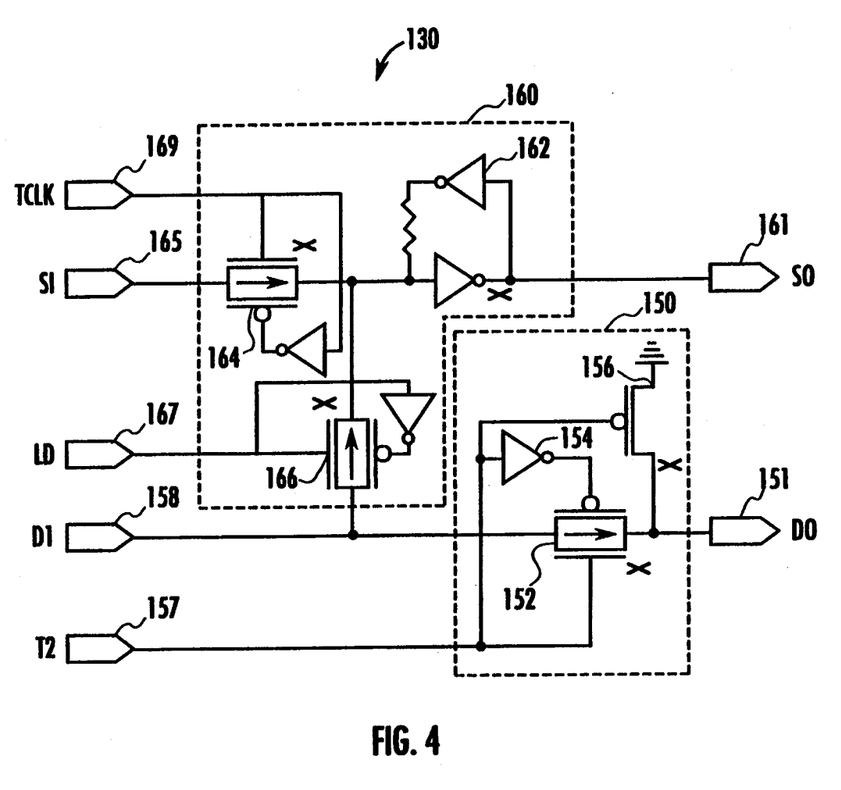
FIG. 4 is a schematic diagram of a drive scan element configured in accordance with another preferred exemplary embodiment of the present invention.

Referring now to FIG. 4, it illustrates the drive scan latch or element 130 in greater detail which may be the drive scan latch 130 of FIG. 3 for practicing the present invention in accordance with this preferred embodiment. The drive scan latch 130 differs from the drive scan latch 30 of FIG. 2 in that it drives a logic LOW while the drive scan latch 30 drives a logic HIGH. Drive scan latch 130 includes a test mode portion 150 and a latch portion 160. The test mode portion 150 includes a transfer gate 152, an inverter 154, and a N-channel field-effect transistor 156. The latch portion 160 includes a transfer gate 164, a transfer gate 166 and a latching element 162. A transfer gate is a pass through gate or other device which allows data at its input to be applied to its output in response to a control signal. Transfer gates 164 and 166 include built-in inverters (not shown) similar to inverter 154. A latching gate or latching element has a feedback mechanism to store logic values.

A test mode input 157 is coupled to the control input of the transfer gate 152. An input of the transfer gate 152 is coupled to a data input 158. The data input 158 is for coupling to the input 136 in FIG. 3. A shift register input 165 is coupled to the input of the transfer gate 164. The output of the transfer gate 164 is coupled to the input of the latching element 162. The output of the latching element 162 is coupled to a shift register output 161. A shift mode input 169 is coupled to the control input of the transfer gate 164. The output of the transfer gate 166 is coupled to the input of the latching element 162.

A capture mode input 167 is coupled to the control input of the transfer gate 166. The data input 158 is coupled to the inputs of the transfer gate 166 and the transfer gate 152. The output of the transfer gate 152 is coupled to a data output 151. The transfer gate 152 is controlled by a test mode input 157.

The output of the inverter 154 is coupled to the inverted control input of the test mode gate 152. The inverted control input allows data to transfer across the transfer gate 152 when the inverted control input is a logic LOW. The gate of the transistor 156 is coupled to the output of the inverter 154. The input of the inverter 154 is coupled to the test mode input 157. The source of the transistor 156 is coupled to a logic ground voltage source (GND), and the drain of the transistor 156 is coupled to the data output 151.

In operation, when the test mode input 157 is a logic HIGH for normal operation, the transfer gate 152 is turned ON and the transistor 156 is turned OFF, as a result data is allowed to be transferred from the data input 158 to the data output 151 without obstruction from the drive element 130. This would permit a sequential element such as latch 120 of FIG. 3 to be clocked by the combination of a logic signal and a system clock signal. When in the test mode and input 157 is a logic LOW, the transfer gate 152 is turned OFF and the transistor 156 is turned ON. As a result, a steady state logic LOW control signal is provided at the data output 151. This would permit the aforementioned latch 120 to be clocked by the system clock signal alone.

The latching element 162 provides shift register and data capture functions for the element 130. When the shift mode input 169 is a logic HIGH, the data at the shift register input 165 is provided to the input of the latching element 162. The latching element 162 provides an inverted data signal at the serial register output 161 in response to a clock signal. The data at the data input 158 may also be provided to the input of the latch 156 when the capture mode input 167 is a logic HIGH. When the capture mode input 167 is a logic HIGH, the transfer gate 166 provides the data at the data input 158 to the input of the latch 156. The latch 156 provides the inverted data to the shift register output 161.

It will be understood that while the various conductors/connectors may be depicted in the drawing as single lines, they are not shown in a limiting sense as understood in the art. Further, the above description is of preferred exemplary embodiments of the present invention, and the invention is not limited to the specific forms shown. For example, while various inverters, AND gates, and OR gates have been shown as logic elements, the invention is not limited to those particular logic elements or combinations of those logic elements. In addition, although only a portion of various ICs have been shown, the invention may be advantageously employed in various different types of ICs such as RISC microprocessors, registers, caches, or in any other ICs where testing of integral digital circuitry is required. Further still, although particular signals are inverted, logic LOW or logic HIGH, the circuit may be modified to accommodate various logic signals. Further, the drive scan latches may be employed to replace any sequential or logic element. These and other modifications may be made in the design and arrangements of the elements discussed herein without departing from the scope of the invention as expressed in the appended claims.

We claim:

1. In an integrated circuit including a circuit formed by a plurality of circuit elements, at least some of said circuit elements being sequential circuit elements with at least one of said sequential circuit elements being clocked at a clock input by a combination of a data signal and a system clock during normal operation, the improvement of a test arrangement enabling said sequential elements to be tested and comprising:
   gate means having an output coupled to said clock input, said gate means having a first gate input and having a second gate input, said first gate input for receiving said system clock; and
   test mode means having an output coupled to said second gate input, a first test input for receiving said data signal and a second test input for receiving a test mode signal, said test mode means conveying a steady state control signal to said second gate input responsive to said test mode signal to cause said at least one sequential circuit element to be clocked by said system clock alone and for conveying said data signal to said second gate input in the absence of said test mode signal to cause said at least one sequential element to be clocked by the combination of said system clock and said data signal, wherein said steady state control signal is a non-programmable signal.

2. The test arrangement of claim 1, further comprising a latch means having a latch input coupled to said first test input of said test mode means for storing said data signal.

3. The test arrangement of claim 2, wherein the latch means comprises:
   a shift mode input;
   a shift register output;
   a transfer gate having a control input coupled to the shift mode input, an output coupled to said latch input, and a data input; and
   wherein the transfer gate allows the signal at said data input of the transfer gate to be applied to said latch input when a shift mode signal is present on the shift mode input.

4. The test arrangement of claim 3, further comprising:
   a capture mode input;
   a capture transfer gate having a control input coupled to said capture mode input, a capture data input coupled to said first test input, and an output coupled to said latch input, wherein the capture transfer gate allows the data signal on said first test input to be applied to said latch input when a signal on the capture mode input is present.

5. The test arrangement of claim 2, further comprising:
   a capture mode input;
   a capture transfer gate having a control input coupled to said capture mode input, a capture data input coupled to said first test input, and an output coupled to said latch input, wherein the capture transfer gate allows the data signal on said first test input to be applied to said latch input when a signal on the capture mode input is present.

6. The test arrangement of claim 1, wherein the steady state is a logic high and the gate means is an AND gate.

7. The test arrangement of claim 1, wherein the gate means is an OR function gate and the steady state signal is a logic low.

8. The integrated circuit of claim 1 wherein the test mode means includes an FET having a drain, a source, and a gate, said drain being coupled to a ground level or a power level representative of the steady state control signal and said source being coupled to said output of said test mode means and said gate being coupled to said second test input.

9. A drive element for use in scan testing an integrated circuit having sequential elements, the drive element comprising:
   a data input;
   a data output;
   a test mode input which receives a test mode signal indicative of a system mode or a test mode;
   a transfer gate coupled between the data input and the data output, the transfer gate being controlled by the test mode input so that the transfer gate allows data to pass from the data input to the data output when the integrated circuit is in the system mode; and
   a transistor for driving a fixed predetermined logic level at the data output when the system is in the test mode, the transistor having a gate coupled to the test mode input, a drain coupled to the predetermined logic level, and a source coupled to the data output wherein the fixed predetermined logic level is permanently set to a logic high or logic low level.

10. The drive element of claim 9, wherein the predetermined logic level is a ground level.

11. The drive element of claim 9, wherein the predetermined logic level is a positive five volts.

12. The drive element of claim 9 wherein the transistor includes a drain terminal, a source terminal, and a gate terminal, the drain terminal being coupled to a logic level indicative of the fixed predetermined logic level, the source terminal being coupled to the data output, and the gate terminal being coupled to the test mode input.

13. The drive element of claim 9, further comprising:
a shift register input;
a capture mode input;
a shift mode input;
a shift register output; and
a latch element coupled to the data input and the shift register input, the latch element receiving data from the shift register input when a signal is present on the shift mode input and receiving data from the data input when a signal is present on the capture mode input, the latch element providing a representation of the received data to the shift register output.

14. The drive element of claim 13, further comprising a shift transfer gate coupled between the latch element and the shift register input.

15. The drive element of claim 13, further comprising a capture transfer gate coupled between the latch element and the data input.

16. In an integrated circuit including a circuit formed by a plurality of circuit elements, at least some of said circuit elements being sequential circuit elements which are clocked by a system clock with at least one of said sequential circuit elements being clocked at a clock input by a combination of both a logic signal and said system clock during normal operation, the improvement comprising test mode means responsive to a test mode signal for driving a predetermined steady state signal and causing said at least one sequential circuit element to be clocked by said system clock alone and being responsive to the absence of said test mode signal to cause said at least one sequential element to be clocked by the combination of said system clock and said logic signal, wherein in the predetermined steady state signal is a non-programmable signal.

17. The test arrangement of claim 16, further comprising a latch means coupled to said test mode means for storing an inverted or non-inverted signal an input of said test mode means.

18. The test arrangement of claim 17, further comprising:
a capture mode input;
a capture transfer gate having a control input coupled to capture mode input, an input coupled to said input of said test mode means, and an output coupled to said latch means, wherein the capture transfer gate allows the signal on said input of said test mode means to be applied to said input of said latch when a signal on the capture mode input is present.

19. The integrated circuit of claim 16 wherein the test mode means includes a transistor having a drain terminal directly coupled to a logic level indicative of the predetermined steady state signal, a source terminal directly coupled to an output of the test mode means, and a gate terminal coupled to receive a control signal indicative of the test mode signal.

20. A drive scan latch for use in an integrated circuit, comprising:
a scan latch input for receiving a data signal;
a scan latch output;
test mode means, coupled between the scan latch input and the scan latch output, for providing an output signal at a predetermined logic level at the scan latch output when a test signal is present and providing the data signal at the scan latch input to the scan latch output when the test signal is absent wherein the predetermined logic level is permanently assigned when the drive scan latch is fabricated,
a shift register input;
a capture mode input;
a shift mode input;
a shift register output;
a latch element coupled to the scan latch input and the shift register input, the latch element receiving data from the shift register input when a signal is present on the shift mode input and receiving data from the scan latch input when a signal is present on the capture mode input, the latch element providing a representation of the received data to the shift register output; and
a shift transfer gate coupled between the latch element and the shift register input.

21. The drive scan latch of claim 20, further comprising a capture transfer gate coupled between the latch element and the data input.

* * * * *